Figure 3:
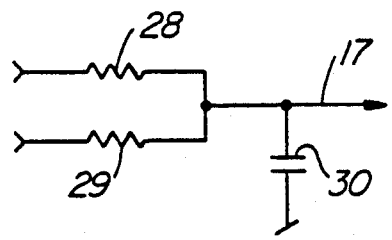

United States Patent [19]

Colbeck et al.

[11] Patent Number: 5,021,681

[45] Date of Patent: Jun. 4, 1991

[54] JITER-INVARIANT SWITCHED CAPACITOR PULSE SHAPER

[75] Inventors: Roger Colbeck, Ottawa; Peter Gillingham, Kanata, both of Canada

[73] Assignee: Mitel Corporation, Kanata, Canada

[21] Appl. No.: 352,544

[22] Filed: May 16, 1989

[30] Foreign Application Priority Data

May 27, 1988 [CA] Canada .................................... 567997

[51] Int. Cl.$^5$ .......................... H03K 5/00; H03B 28/00
[52] U.S. Cl. ..................................... 307/261; 307/268; 328/27; 341/150
[58] Field of Search ...................... 328/27, 55, 74, 162, 328/164, 165, 167; 307/520, 521, 268, 260, 261; 364/825, 724.01, 602; 341/144, 150; 377/42, 71, 73; 375/103

[56] References Cited

U.S. PATENT DOCUMENTS

| | | | |
|---|---|---|---|
| 4,467,319 | 8/1984 | Uchikoshi | 377/42 |
| 4,542,371 | 9/1985 | Uchikoski | 328/162 |
| 4,751,666 | 6/1988 | Gillingham | 364/602 |
| 4,814,637 | 3/1989 | Roessler et al. | 328/14 |

Primary Examiner—Timothy P. Callahan
Attorney, Agent, or Firm—Alan H. Levine

[57] ABSTRACT

An output pulse signal can be fabricated in an integrated circuit from an input signal. The output signal retains the desired pulse shape unaffected by jitter. A switched capacitor FIR filter is used to form the pulse shape, and then the clocking of the digital signals used to operate the pulse shaper is controlled to control the timing of different segments. The result is an output signal which has jitter but retains the desired pulse shape. Since a phase corrector which senses jitter can control the clocking, the output pulse shape is unaffected by jitter. The output pulse signal can be produced in an integrated circuit since switched capacitor pulse shapers are used, rather than a continuous time filter. More particularly, an analog pulse signal is produced from an input digital signal by applying the input signal to serial shift registers, each spanning less than a baud, operating switched corresponding ones of the shift registers to form different parts of an output signal, summing the output signals in time to form a combined output signal, and low pass filtering the combined output signal to form the analog pulse signal.

9 Claims, 2 Drawing Sheets

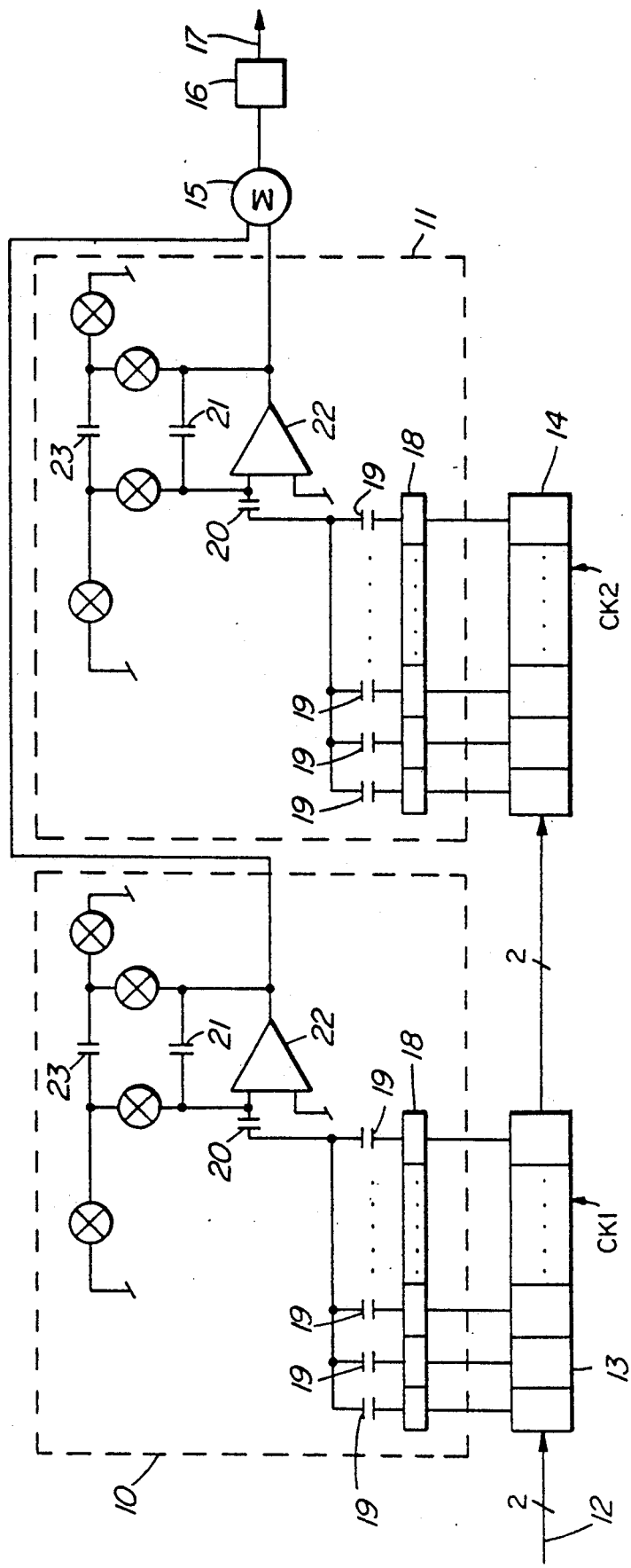

JITER-INVARIANT SWITCHED CAPACITOR PULSE SHAPER

This invention relates to data transceivers, and in particular to a pulse shaper for translating digital data into predetermined pulse shapes.

Typical digital data transceivers in digital line interface circuits translate digital data, e.g. two parallel bits per baud, into one of four pulse shaped symbols such as −3, −1, +1 or +3. Each shape spans more than one baud in time, and thus the resulting output pulses overlap the composite signal. This composite signal is the sum of the present signal being transmitted plus the previous baud's symbol.

The composite signal must be linear, since any non-linearities will degrade the performance of an echo canceller which may be used in a transmission loop. One source of non-linearity is jitter, which causes pulse shape changes.

One type of transmitter for such a transceiver is comprised of a digital to analog converter followed by a low pass filter. A technique for retaining the pulse width is to use a return-to-zero (RZ) pulse at the output of the digital-to-analog converter, rather than non-return-to-zero (NRZ).

When a phase correction is to be made in the above system, the pulse can simply be started sooner or later. Since the previous symbol has returned to zero between pulses, the pulse shape is not altered, but is only moved. Moving the present pulse may be compensated for by an echo canceller with jitter compensation or by other means.

However it has been found that the above implementation is not suitable for integrating in an integrated circuit since the pulse shape is created by a continuous time active filter, which cannot be accurately integrated.

The present invention provides an output pulse signal from an input digital signal which can be fabricated in an integrated circuit, and produces an output signal which retains the desired pulse shape unaffected by jitter. In the present invention the pulse shape is formed by using a switched capacitor FIR filter to form the pulse shape (referred to herein as a pulse shaper), and then by controlling the clocking of the digital signals used to operate the pulse shaper to control the timing of different segments. The result is an output signal which has jitter but retains the desired pulse shape. Since a phase corrector which senses jitter can control the clocking, the output pulse shape is unaffected by jitter. The invention can be produced in an integrated circuit since switched capacitor pulse shapers are used, rather than a continuous time filter.

More generally, one embodiment of the invention is comPrised of means for receiving a digital signal, at least two switched capacitor pulse shapers, apparatus for applying successive portions of the digital signal, each portion being less than a baud of the signal, into corresponding ones of the pulse shapers, whereby pulse shapes are produced by the pulse shapers that include at least a rising and trailing edges of a pulse. Apparatus is included for summing the outputs of the pulse shapers in time to form the combined output pulse. Finally a coarse low pass filter filters the combined output pulse to form an analog output pulse signal.

Another embodiment of the invention is a method for producing an analog pulse signal from an input digital signal comprising applying the input digital signal to serial shift registers, each spanning less than a baud, operating switched capacitor pulse shapers from signals stored on corresponding ones of the shift registers to form different parts of an output signal, summing the output signals in time to form a combined output signal, and low pass filtering the combined output signal to form the analog pulse signal.

Figure 4:
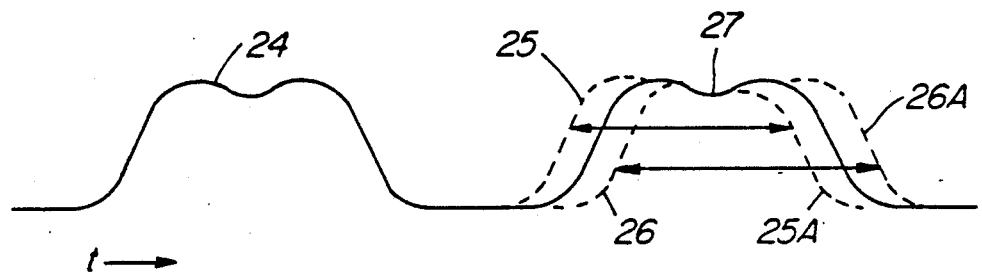
Figure 5:
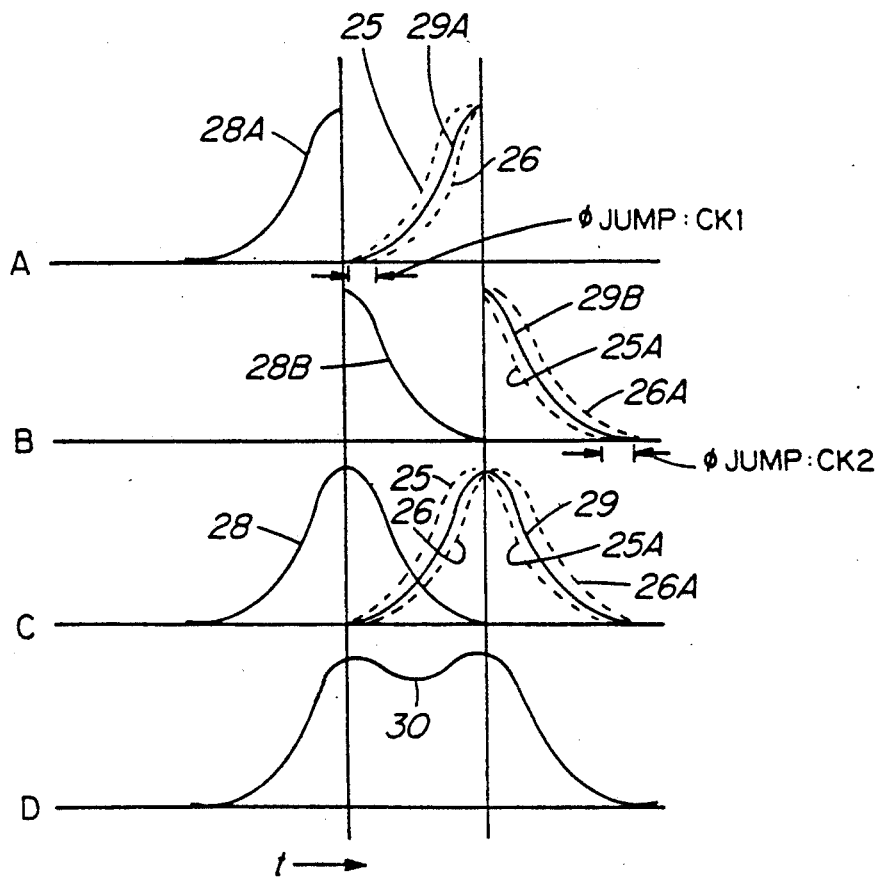

A better understanding of the invention will be obtained by reference to the detailed description below, in conjunction with the following drawings, in which:

FIG. 1A represents a pulse signal to be transmitted from a digital input signal, FIG. 1B is an output pulse signal which is carried by a transmission line resulting from the signal of FIG. 1A, FIG. 2 is a block diagram of the present invention, FIG. 3 is a schematic diagram of the output filter used with FIG. 2, and FIGS. 4 and 5 illustrate parts of, and the complete pulse signal, to illustrate the present invention.

In a transceiver integrated circuit chip of the type to which the present invention is directed, an input digital signal comprised of two parallel bits per baud is to be translated into one of four pulse shapes, namely −3, −1, +1 or +3. Successive ones of the pulse shapes is shown in FIG. 1A. Each shape spans more than one baud in time, and thus output pulses overlap to form a composite signal as shown in FIG. 1B. Each composite signal is the sum of the present symbol being transmitted plus the previous baud's symbol.

If the digital input signal were to be applied to a shift register and translated into a pulse shape by a switched capacitor pulse shaper, the operational amplifier, which forms a summer, would suffer from jitter since the summation is being formed by a sampled-data circuit rather than a continuous time filter. Jitter will alter the pulse width of the switched capacitor clocks, and this will cause changes in the pulse shape. As noted earlier this forms a non-linearity in the output signal which degrades the performance of an echo canceller used in the transmitting circuit. In accordance with the present invention, two or more switched capacitor pulse shapers, represented by the two pulse shapers 10 and 11 shown in FIG. 2 are used as will be described below.

A digital input signal is received on the input lines 12, the input signal being formed of two parallel bits per baud. The signal is applied to the input of shift register 13, which is connected in series with shift register 14. The shift registers are separately clocked from clock sources CK1 and CK2.

The parallel outputs of shift registers 13 and 14 are applied to switched capacitor pulse shapers 10 and 11. Switched capacitor pulse shapers are sometimes called switched capacitor digital to analog converters, which explains their function.

The outputs of the switched capacitor pulse shapers are applied to a summer 15, for summing the output signals therefrom, and the output of summer 15 is applied to the input of a coarse low pass filter 16. The composite output signal is carried by the output line 17 of filter 16.

Each of the switched capacitor pulse shapers is described in the article "A 160-KB/S Digital Subscriber Loop Transceiver with Memory Compensation Echo Canceller", by R.P. Colbeck and P.B. Gillingham, IEEE JSSC, Vol. SC-21, No. 1, pp 65–72, Feb. 1986, and the description thereof is incorporated herein by reference.

Each of the switched capacitor pulse shapers is formed of switches 18 which switch a positive or negative unit voltage value into corresponding capacitors 19. By charge sharing with capacitors 20, 21 and 23, the latter two being feedback capacitors around operational amplifier 22, in a well known manner, the digital signal stored in shift register 13 is converted to a pulse signal at the output of operational amplifier 22, and the digital signal stored in shift register 14 is converted to an unit pulse signal at the output of operational amplifier 22 in switched capacitor pulse shaper 11.

It should be noted that by switching capacitor 24 in or out around capacitor 23, the output voltage may be multiplied by three, to provide a +3 or −3 pulse amplitude output rather than +1 or −1.

In operation, the input signal is continuously shifted into shift register 13 followed by shift register 14. Clocks CK1 and CK2 are operated in synchronism. Each shift register has the capacity to store less than a baud of the input signal.

When a phase correction is to be made, the clock timing of CK1 is altered, to retard or advance the generation of the present pulse, while at the same time clock CK2 continues to control the timing of the latter part of the previous pulse with the previous time base.

At the end of the current baud, the timing of CK2 is switched to be identical to that of clock CK1. This causes the second shift register 14 to operate so that the rest of the output pulse is generated with the correct timing. With the clocks CK1 and CK2 in synchronism, they continue to operate with this new time base until another phase correction is required, then the procedure is repeated.

It should be noted that the shift registers should have less than one baud capacity, or the capacity less than the jitter repetition period, whichever is smaller. It should also be noted that the clocks CK1 and CK2 shOuld be tOgether in synchronism, when the outputs from the stage 11 is zero.

FIGS. 4 and 5 show a representative output signal, being a sequence of simple plus one pulses. The time axis is from left to right.

Pulse 24 in FIG. 4 requires no correction and is generated with clocks CK1 and CK2 in synchronism. Now assuming that the transceiver phase locked loop has sensed jitter in the input signal (which would produce the following solid-line indicated pulse), an error signal will be produced in a well known manner. Clearly a phase correction is required. The phase correction can be to either advance the leading edge of the following pulse to position 25 or to retard it to position 26. In order to perform the phase correction, the clock CK1 timing is externally altered, advancing or retarding the generation of the pulse 27. The first part of the pulse is thus generated with new leading edge timing, while the latter portion of the previous pulse 24 is generated due to the signal stored in shift register 14 using the previous clock time base CK2.

In FIG. 5 this is shown along the axes A, B, C and D where along axes A and B the first pulse of the baud is comprised of a leading edge 28A and a trailing edge 28B, forming a complete pulse 28, as shown along axis C, and wherein the second pulse of the baud is comprised of a leading edge 29A and a trailing edge 29B, forming the complete pulse 29 (axis C), which corresponds to pulse 27 in FIG. 4.

When the output of the switched capacitor filter 11 becomes zero, representing the output pulse from that stage as having been completed, clock CK2 is switched to be in synchronism with clock CK1. The remainder of pulse 27 is generated, with a correct pulse width, due to the time base of clock CK2 having changed to be in synchronism with that of clock CK1. The trailing edge of pulse 27 will thus be either 25A or 26A, depending on whether the pulse was advanced to leading edge 25 or retarded to leading edge 26. The succeeding pulses are generated in timing conformance with the newly synchronized clocks CK1 and CK2. The process is repeated should another phase correction be required.

This can be seen in FIG. 5, in which the leading edge 29A of the second pulse of the baud is subject to phase correction by the phase jump of clock CK1 and the trailing edge of the second pulse 29B is subject to phase correction by the phase jump of clock CK2, resulting in a complete second pulse 29. The phase corrections are shown along axes A, B and C with the advanced or retarded pulse positions using the same reference numerals as in FIG. 4 (25, 25A and 26, 26A) to make the relationships between the pulses as clear as possible. Axis C shows the composite pulses 28 and 29, or 28, 25 and 25A, or 28, 26 and 26A, prior to addition.

The resulting output signals of each of the switched capacitor pulse shapers 10 and 11 are summed in summer 15. Summer 15 can be formed merely of resistors 28 and 29 as shown in FIG. 3, having respective inputs connected to the outputs of operational amplifiers 22 respectively. The output from joined resistors 28 and 29 is applied to output lead 17 to which is connected bypass capacitor 30. Resistors 28 and 29 with capacitor 30 form a coarse low pass filter, which is inexpensive and is sufficient to provide the required output signal. The resulting total signal 30 is shown along axis D in FIG. 5.

The present invention facilitates manufacture of an integrated circuit for converting digital input signals to output pulse shapes, and for maintaining the pulse shapes while being devoid of changes in pulse shapes caused by jitter. The result is an improved and inexpensive circuit that can be used in a digital transceiver chip.

A person understanding this invention may now conceive of variations or alternative structures using the principles described herein. All are considered to be within the sphere and scope of the invention as defined in the claims appended hereto.

We claim:

1. A pulse shaper comprising:
   (a) means for receiving a digital signal,
   (b) at least two switched capacitor pulse shapers,
   (c) means for applying successive portions of said digital signal, each portion being less than a baud of said signal, into corresponding ones of said pulse shapers, whereby pulse shapes are produced by the pulse shapers that include at least rising and trailing edges of a pulse,
   (d) means for summing the outputs of the pulse shapers in time to form a combined output pulse, and
   (e) means for low pass filtering the combined output pulse to form an analog output pulse signal.

2. A pulse shaper as defined in claim 1, including means for varying a time of applying one or more of said portions of said digital signal into said pulse shapers to correct the phase of the rising and/or trailing edge of the combined output pulse, and thus of the start and/or completion of the analog output pulse.

3. A pulse shaper as defined in claim 2, in which said portions applying means is comprised of separately clockable serial shift register means for receiving said digital signal, parallel outputs of the separately clockable shift register means being applied to corresponding ones of the pulse shapers.

4. A pulse shaper as defined in claim 3 in which said means for varying the time is comprised of separate clock sources connected to individual ones of the separately clockable shift register means.

5. A pulse shaper as defined in claim 4, in which the separately clockable shift register means is comprised of at least a pair of serially connected shift registers for receiving and storing successive bauds of the digital signal, each shift register being separately clockable for retarding or advancing the timing of separate parts of the combined output pulse.

6. A pulse shaper as defined in claim 5 in which means for low pass filtering is comprised of a resistor-capacitor filter.

7. A method for producing an analog pulse signal from an input digital signal comprising applying the input digital signal to serially connected shift registers each spanning less than a baud, operating switched capacitor pulse shapers from signals stored on corresponding ones of the shift registers to form different parts of an output signal, summing the output signal parts in time to form a combined output signal, and low pass filtering the combined output signal to form said analog pulse signal.

8. A method as defined in claim 7 including clocking the shift registers at different times to advance or retard the timing of the respective parts of the output signal to substantially avoid jitter.

9. A method as defined in claim 8 including applying the input signal to a first and a serially connected second shift register, clocking the shift registers together when no phase correction is required, advancing or retarding the clocking of the first shift register to correct phase of a current pulse being generated, then clocking the second shift register in synchronism with the first shift register at the end of the current baud of the input signal to complete the pulse with correct timing and substantially no jitter.

* * * * *